United States Patent
Zhao et al.

(10) Patent No.: US 11,844,289 B2
(45) Date of Patent: Dec. 12, 2023

(54) SECOND GENERATION HIGH-TEMPERATURE SUPERCONDUCTING (2G-HTS) TAPE AND FABRICATION METHOD THEREOF

(71) Applicant: Shanghai Jiaotong University, Shanghai (CN)

(72) Inventors: Yue Zhao, Shanghai (CN); Chunjiang Guo, Shanghai (CN); Yue Wu, Shanghai (CN); Sikan Chen, Shanghai (CN); Jiamin Zhu, Shanghai (CN); Wei Wu, Shanghai (CN); Zhijian Jin, Shanghai (CN)

(73) Assignee: Shanghai Jiaotong University, Shanghai (CN)

( * ) Notice: Subject to any disclaimer, the term of this patent is extended or adjusted under 35 U.S.C. 154(b) by 3 days.

(21) Appl. No.: 18/154,826

(22) Filed: Jan. 14, 2023

(65) Prior Publication Data
US 2023/0157184 A1 May 18, 2023

(30) Foreign Application Priority Data
Apr. 8, 2022 (CN) .......................... 202210366000.8

(51) Int. Cl.
*H10N 60/20* (2023.01)
*H10N 60/01* (2023.01)
*H01B 12/06* (2006.01)

(52) U.S. Cl.
CPC .......... *H10N 60/203* (2023.02); *H01B 12/06* (2013.01); *H10N 60/0521* (2023.02); *H10N 60/0688* (2023.02)

(58) Field of Classification Search
CPC ............ H10N 60/203; H10N 60/0521; H10N 60/0688; H10N 60/0632; H10N 60/0801; H01B 12/06; Y02E 40/60
See application file for complete search history.

(56) References Cited

U.S. PATENT DOCUMENTS

2015/0357089 A1* 12/2015 Oh .......................... H10N 60/01 505/410
2019/0379145 A1* 12/2019 Yamano ................... H01R 4/68

FOREIGN PATENT DOCUMENTS

CN     1849715 A    10/2006
CN   107103957 A     8/2017
(Continued)

OTHER PUBLICATIONS

Zhou et al. ("Review of progress and challenges of key mechanical issues in high-field superconducting magnets," National Science Review, Jan. 6, 2023) (Year: 2023).*

(Continued)

*Primary Examiner* — Yasser A Abdelaziez

(57) ABSTRACT

A method for fabricating a second generation high-temperature superconductor (2G-HTS) tape, including: (S1) depositing a superconducting thin film on a surface of a ductile metal substrate with a buffer layer; (S2) forming a micro-holes array pattern on a surface of the superconducting thin film by etching using a reel-to-reel dynamic femtosecond infrared laser etching system, where the micro-holes array pattern covers the superconducting thin film; (S3) depositing a superconducting thick film on the surface of the superconducting thin film; and (S4) depositing a silver protective layer and a copper stabilization layer on a surface of the superconducting thick film.

8 Claims, 4 Drawing Sheets

(56) References Cited

FOREIGN PATENT DOCUMENTS

| CN | 112259673 A | 1/2021 |
|---|---|---|
| CN | 113140371 A | 7/2021 |
| CN | 113257477 A | 8/2021 |
| JP | H01259582 A | 10/1989 |
| JP | 2015032362 A | 2/2015 |

OTHER PUBLICATIONS

Zhao et al. ("Progress in fabrication of second-generation high temperature superconducting tape at Shanghai Superconductor Technology," Superconductor Science and Technology, 32, 2019) (Year: 2019).*

* cited by examiner

SECOND GENERATION HIGH-TEMPERATURE SUPERCONDUCTING (2G-HTS) TAPE AND FABRICATION METHOD THEREOF

CROSS-REFERENCE TO RELATED APPLICATIONS

This application claims the benefit of priority from Chinese Patent Application No. 202210366000.8, filed on Apr. 8, 2022. The content of the aforementioned application, including any intervening amendments thereto, is incorporated herein by reference in its entirety.

TECHNICAL FIELD

This application relates to superconducting materials, and more particularity to a second generation high-temperature superconducting (2G-HTS) tape and a fabrication method thereof.

BACKGROUND

Second generation high-temperature superconducting (2G-HTS) tapes featuring a rare-earth barium copper oxide (REBCO) core functional layer are considered as one of the most promising and practical materials. Compared to other practical superconducting materials, the 2G-HTS tapes have higher transition temperature, superior current-carrying capacity and higher irreversible field, and thus have been widely appreciated in medical, military and energy fields.

Superconducting equipment fabricated from the 2G-HTS tapes will be subjected to complex electromagnetic loads during operation. Considering that the REBCO superconducting layer intrinsically has a critical compressive strain significantly high than a critical tensile strain, the superconducting tape is usually designed in such a way that it is bent toward a side with a superconducting layer (inward bending), so that the REBCO superconducting layer is in a compressed state. Therefore, the compressive strain is one of the most common mechanical loads on 2G-HTS tapes. Unfortunately, the REBCO materials have typical oxide ceramic properties, and thus are highly sensitive to compressive stress/strain. When the compressive stress/strain applied to the 2G-HTS tape exceeds the irreversible compressive stress/strain of the REBCO, macroscopic defects (such as cracks and delamination) will occur in the superconducting layer, which will further lead to irreversible degradation on the critical current of the 2G-HTS tapes, seriously affecting the reliable operation of the superconducting equipment.

In order to better investigate the effect of compressive strain on the critical current of the 2G-HTS tapes, a U-Spring is employed to evaluate the mechanical and electrical properties of the 2G-HTS tapes at the liquid nitrogen temperature or below, and determine the irreversible compressive strain (i.e., the maximum compressive strain corresponding to the critical current greater than 99% of the initial critical current after unloading). FIG. 1 shows the critical current retention rate of the existing 2G-HTS tapes under different compressive strains, where the critical current retention rate is a ratio of the critical current under the corresponding compressive strain condition to the initial critical current. Referring to FIG. 1, the solid line and dashed line represent the strain loading process and the strain unloading process, respectively, and a right end of the dashed line corresponds to the critical current retention rate after the complete unloading. As revealed by FIG. 1, the irreversible compressive strain of the existing 2G-HTS tapes ranges from 0.2% to 0.75% (all less than 0.8%), and under the same compressive strain, different samples vary significantly in terms of the critical current retention rate. FIG. 2 is a scanning electron microscope (SEM) image of the superconducting layer of the existing 2G-HTS tapes after the compressive test, in which significant crack defects are observed on the superconducting layer. The high scattering of the irreversible compressive strain poses a challenge for the design of superconducting equipment, and seriously affects the stable operation of the superconducting equipment.

SUMMARY

An object of this disclosure is to provide a second generation high-temperature superconducting (2G-HTS) tape and a fabrication method thereof to overcome the problem of poor stability of the existing 2G-HTS tapes under an irreversible compressive strain.

Technical solutions of this application are specifically described as follows.

In a first aspect, this application provides a method for fabricating a 2G-HTS tape, comprising:

(S1) depositing a first superconducting film on a surface of a ductile metal substrate, wherein the ductile metal substrate is provided with a buffer layer;

(S2) forming a micro-holes array pattern on a surface of the first superconducting film by etching using a reel-to-reel dynamic femtosecond infrared laser etching system, wherein the micro-holes array pattern covers the first superconducting film;

(S3) depositing a second superconducting film on the surface of the first superconducting film; wherein a thickness of the second superconducting film is larger than that of the first superconducting film; and (S4) depositing a silver protective layer and a copper stabilization layer on a surface of the second superconducting film to fabricate the 2G-HTS tape.

In some embodiments, in step (S1), a structure of the buffer layer is selected from the group consisting of ceric dioxide ($CeO_2$)/yttria-stabilized zirconia (YSZ)/yttrium(III) oxide ($Y_2O_3$), magnesium oxide (MgO), lanthanum manganate ($LaMnO_3$)/MgO/$Y_2O_3$/Al—O and $CeO_2$/MgO/$Y_2O_3$/Al—O.

In some embodiments, in step (S1), the ductile metal substrate is made of a nickel-based high-temperature alloy; and a length of the ductile metal substrate is 50-1500 m.

In some embodiments, in step (S1), the first superconducting film is a rare-earth barium copper oxide (REBCO) layer deposited in situ; and a thickness of the first superconducting film is 100-1000 nm.

In some embodiments, in step (S2), a wavelength of a femtosecond infrared laser of the reel-to-reel dynamic femtosecond infrared laser etching system is 1030 nm.

In some embodiments, in step (S2), an etched hole density of the micro-holes array pattern is 25-1000/$mm^2$; an etched hole diameter is less than 50 μm; and an etched hole depth is not greater than a thickness of the first superconducting film.

In some embodiments, in step (S3), the second superconducting film is a rare-earth barium copper oxide (REBCO) layer deposited in situ; and the thickness of the second superconducting film is 500-5000 nm.

In a second aspect, this application provides a 2G-HTS tape fabricated by the above-mentioned method, wherein a critical current degradation of the 2G-HTS tape at 77 K in self-field is less than 5%; an irreversible compressive strain of the 2G-HTS tape measured at a liquid nitrogen temperature or below by a U-Spring technology is not less than 0.8%; and a standard deviation of a critical current retention rate of the 2G-HTS tape under a 0.8% compressive strain is equal to or less than 5%.

Regarding the 2G-HTS tape fabricated by the method provided herein, a microscopic defect structure (including non-oriented polycrystal and secondary non-superconducting phase) will occur at the etched hole, which can promote the stress relief under a compressive strain, so as to prevent the occurrence of macroscopic defects (includes cracks and delamination) at the superconducting layer, improving the stability of the 2G-HTS tape under the irreversible compressive strain. Moreover, the critical current degradation of the 2G-HTS tape at 77 K in self-field is less than 5%; the irreversible compressive strain of the 2G-HTS tape measured at a liquid nitrogen temperature or below by the U-Spring technology is not less than 0.8%; and the standard deviation of the critical current retention rate under the 0.8% compressive strain is less than 5%. Therefore, this application significantly enhances the batch stability, and overcome the problem of poor stability under the irreversible compression strain.

The technical solutions of the present disclosure will be described in detail below with reference to the accompanying drawings and embodiments.

BRIEF DESCRIPTION OF THE DRAWINGS

The patent or application file contains figures executed in color. Copies of this patent or patent application publication with color drawing(s) will be provided by the Office upon request and payment of the necessary fee.

DETAILED DESCRIPTION OF EMBODIMENTS

The present disclosure will be described in detail below with reference to the embodiments and accompanying drawings.

Example 1

Provided herein was a method for fabricating a second generation high-temperature superconducting (2G-HTS) tape, including the following steps.

(S1) A superconducting thin film was deposited in situ on a surface of a ductile metal substrate containing a buffer layer by pulsed laser deposition (PLD), where the buffer layer was a biaxially textured $CeO_2/MgO/Y_2O_3/Al$—O buffer layer; the ductile metal substrate was made of a C276 nickel-based high-temperature alloy, and had a length of 50 m; and the superconducting thin film was a gadolinium (Gd) barium copper oxide (GdBCO) film with a thickness of 1000 nm.

(S2) A micro-holes array pattern was formed on a surface of the superconducting thin film by etching using a reel-to-reel dynamic femtosecond infrared laser etching system, where the micro-holes array pattern covered the superconducting thin film; the reel-to-reel dynamic femtosecond infrared laser etching system was available in the prior art, including a high-precision reel-to-reel mechanical drive system, vacuum equipment, a femtosecond infrared laser and an optical path system with mirrors; a wavelength of the femtosecond infrared laser was 1030 nm; an etched hole density was $375/mm^2$; an etched hole diameter was 5 μm; and an etched hole depth was 800 nm.

(S3) A superconducting thick film was deposited in situ on the surface of the superconducting thin film by PLD, where the superconducting thick film was a GdBCO film with a thickness of 3000 nm.

(S4) A silver protective layer and a copper stabilization layer were deposited on a surface of the superconducting thick film.

Figure 1:
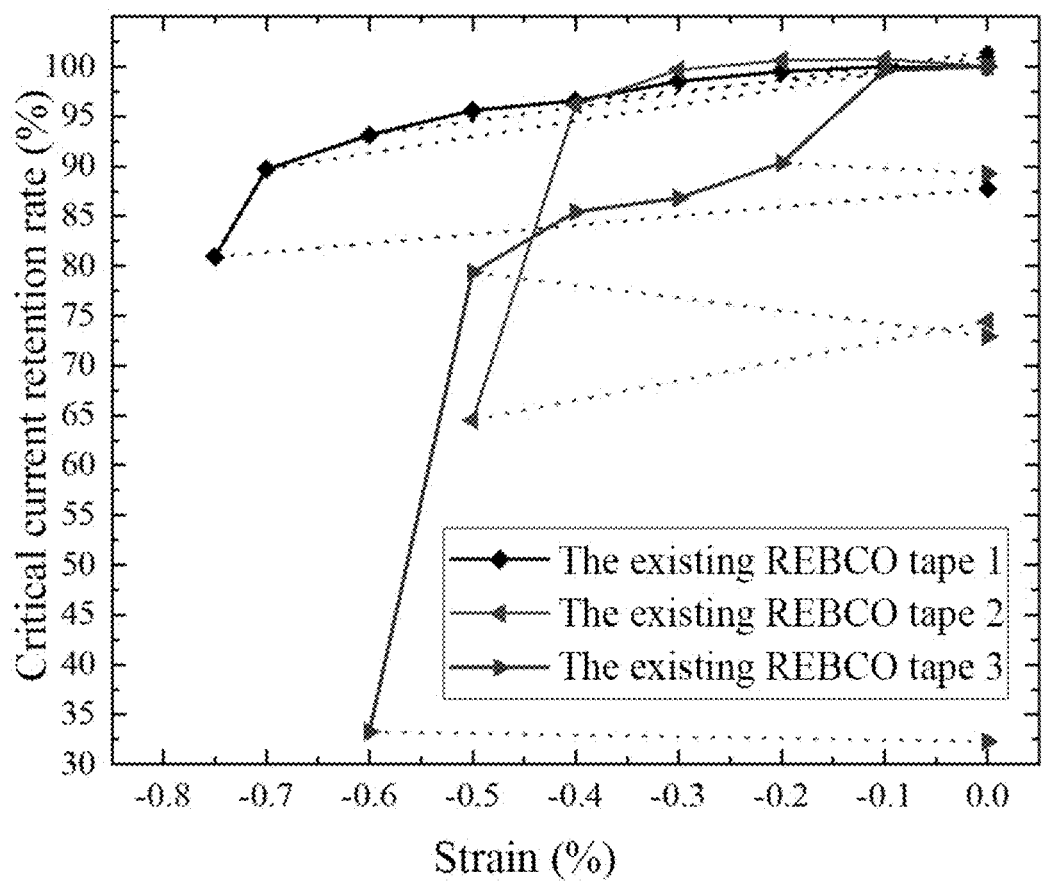
FIG. 1 shows critical current retention rates of several existing 2G-HTS tapes under different compressive strains.
Figure 2:
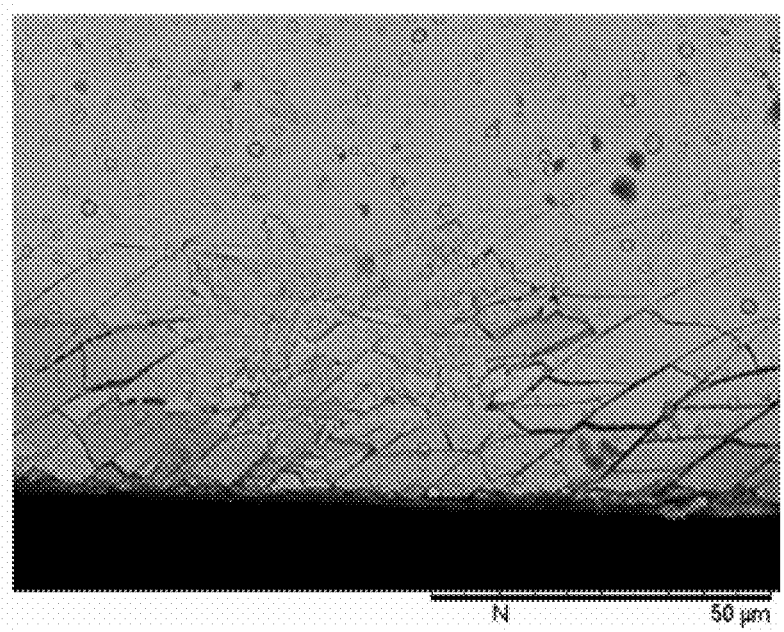
FIG. 2 is a scanning electron microscope (SEM) image of a superconducting layer of the existing 2G-HTS tape after compression test.
Figure 3:
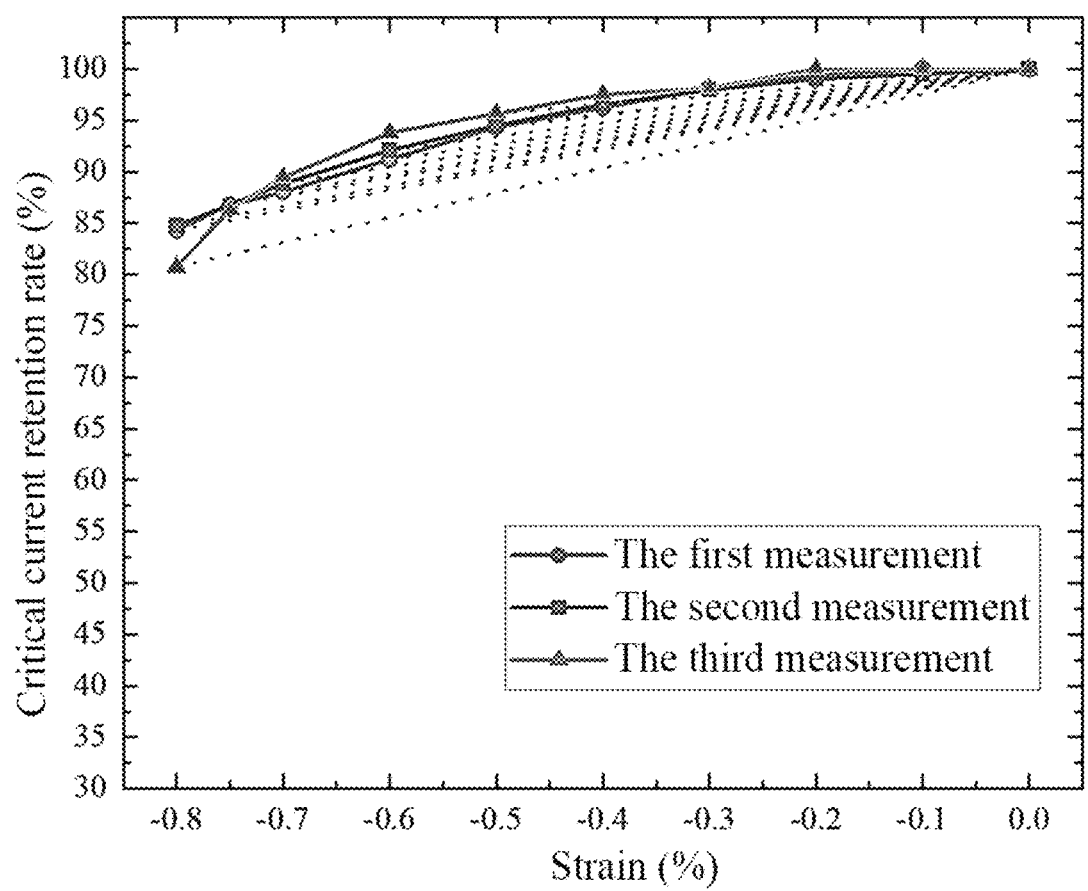
FIG. 3 illustrates a relationship between compressive strain and critical current retention rate of a 2G-HTS tape of Example 1 of the disclosure.

The relationship between compressive strain and critical current retention rate of the 2G-HTS tape was shown in FIG. 3, in which the solid line represented the strain loading process; the dashed line represented the strain unloading process; and a right end of the dashed line corresponded to the critical current retention rate after the complete strain unloading. Regarding the 2G-HTS tape fabricated herein, a critical current degradation at 77 K in self-field was 3.5%, and an irreversible compressive strain measured by a U-Spring technology at a liquid nitrogen temperature or below was not less than 0.8%.

Figure 4A:
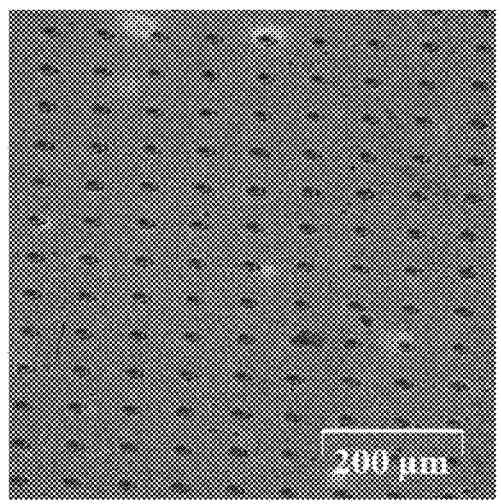
FIG. 4A is an SEM image of etched holes of the 2G-HTS tape according to an embodiment of the disclosure.
Figure 4B:
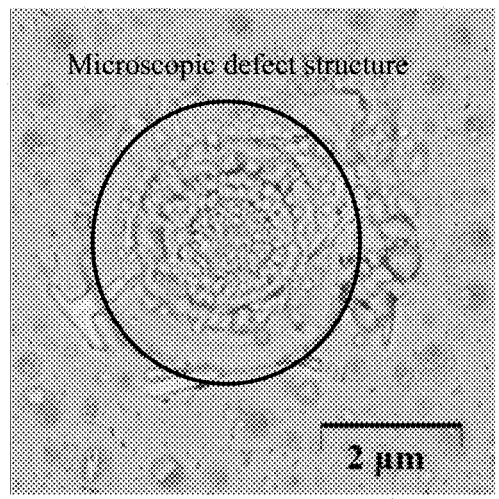
FIG. 4B is an SEM image of a microscopic defect structure of the 2G-HTS tape according to an embodiment of the disclosure.
Figure 5:
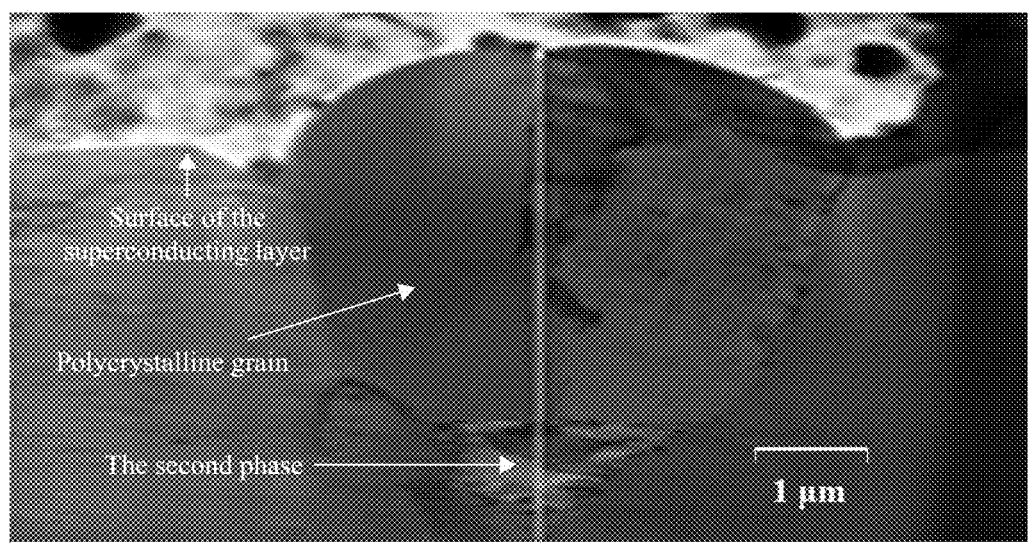
FIG. 5 is an SEM image of a cross section of the microscopic defect structure of the 2G-HTS tape according to an embodiment of the disclosure.

FIG. 4A was an SEM image of etched holes, and FIG. 4B was an SEM image of the microscopic defect structure. FIG. 5 was an SEM image of a cross section of the microscopic defect structure. Regarding the 2G-HTS tape fabricated in Example 1, there was a microscopic defect structure at the etched holes, including unoriented polycrystalline grain and non-superconducting second phase. The microscopic defect structure could promote the stress relief under compressive strain, so as to prevent the occurrence of macroscopic defect (includes cracks and delamination) at the superconducting layer, improving the stability of the 2G-HTS tape under the irreversible compressive strain.

Example 2

Provided herein was a method for fabricating a 2G-HTS tape, including the following steps.

(S1) A superconducting thin film was deposited in situ on a surface of a ductile metal substrate containing a buffer layer by pulsed laser deposition (PLD), where the buffer layer was a biaxially textured $LaMnO_3/MgO/Y_2O_3/Al$—O buffer layer; the ductile metal substrate was made of a C276 nickel-based high-temperature alloy, and had a length of 1500 m; and the superconducting thin film was a yttrium (Y) barium copper oxide (YBCO) film with a thickness of 100 nm.

(S2) A micro-holes array pattern was formed on a surface of the superconducting thin film by etching using a reel-to-reel dynamic femtosecond infrared laser etching system, where the micro-holes array pattern covered the superconducting thin film; the reel-to-reel dynamic femtosecond infrared laser etching system was available in the prior art, including a high-precision reel-to-reel mechanical drive system, vacuum equipment, a femtosecond infrared laser and an optical path system with mirrors; a wavelength of the femtosecond infrared laser was 1030 nm; an etched hole density was 25/mm², an etched hole diameter was 50 μm; and an etched hole depth was 80 nm.

(S3) A superconducting thick film was deposited in situ on the surface of the superconducting thin film by PLD, where the superconducting thick film was a YBCO film with a thickness of 500 nm.

(S4) A silver protective layer and a copper stabilization layer were deposited on a surface of the superconducting thick film.

Regarding the 2G-HTS tape fabricated by the method of Example 2, a critical current degradation at 77 K in self-field was 2.3%, an irreversible compressive strain measured at a liquid nitrogen temperature or below by a U-Spring technology was not less than 0.8%, and a standard deviation of a critical current retention rate under a 0.8% compressive strain was 3.1%.

Example 3

Provided herein was a method for fabricating a 2G-HTS tape, including the following steps.

(S1) A superconducting thin film was deposited in situ on a surface of a ductile metal substrate containing a buffer layer by pulsed laser deposition (PLD), where the buffer layer was a biaxially textured $CeO_2$/YSZ/$Y_2O_3$ buffer layer; the ductile metal substrate was made of a C276 nickel-based high-temperature alloy, and had a length of 500 m; and the superconducting thin film was a europium (Eu) barium copper oxide (EuBCO) film with a thickness of 1000 nm.

(S2) A micro-holes array pattern was formed on a surface of the superconducting thin film by etching using a reel-to-reel dynamic femtosecond infrared laser etching system, where the micro-holes array pattern covered the superconducting thin film; the reel-to-reel dynamic femtosecond infrared laser etching system was available in the prior art, including a high-precision reel-to-reel mechanical drive system, vacuum equipment, a femtosecond infrared laser and an optical path system with mirrors; a wavelength of the femtosecond infrared laser was 1030 nm; an etched hole density was 1000/mm²; an etched hole diameter was 3 μm; and an etched hole depth was 700 nm.

(S3) A superconducting thick film was deposited in situ on the surface of the superconducting thin film by PLD, where the superconducting thick film was an EuBCO film with a thickness of 5000 nm.

(S4) A silver protective layer and a copper stabilization layer were deposited on a surface of the superconducting thick film.

Regarding the 2G-HTS tape fabricated by the method of Example 3, a critical current degradation at 77 K in self-field was 4.6%, an irreversible compressive strain measured at a liquid nitrogen temperature or below by a U-Spring technology was not less than 0.8%, and a standard deviation of a critical current retention rate under a 0.8% compressive strain was 1.1%.

Comparative Example 1

The fabrication method of Comparative Example 1 was basically the same as that of Example 1 except that in this example, the superconducting thin film was not subjected to etching, and the superconducting thick film was directly deposited on the superconducting thin film.

Regarding the 2G-HTS tape fabricated in Example 1, the standard deviation of the critical current retention rate under a 0.8% compressive strain was 1.7%, as shown in Table 1.

TABLE 1

| | Critical current retention rate under 0.8% compressive strain | | | | | |
|---|---|---|---|---|---|---|
| | Critical current retention rate | | | | | Standard |
| Test No. | 1 | 2 | 3 | 4 | 5 | deviation |
| Example 1 | 85% | 81% | 83% | 82% | 83% | 1.7% |
| Comparative Example 1 | 68% | 33% | 55% | 18% | 72% | 23% |

Comparative Example 2

The fabrication method of Comparative Example 2 was basically the same as that of Example 1 except that in the step (S2), an etched hole density was 1600/mm²; an etched hole diameter was 10 μm; and an etched hole depth was 1500 nm.

Regarding the 2G-HTS tape fabricated by the fabrication method of Comparative Example 2, a critical current degradation at 77 K in self-field was 22%, an irreversible compressive strain measured at a liquid nitrogen temperature or below by a U-Spring technology was not less than 0.8%, and a standard deviation of a critical current retention rate under a 0.8% compressive strain was 1.3%.

Comparative Example 3

The fabrication method of Comparative Example 3 was basically the same as that of Example 1 except that in the step (S2), the micro-holes array pattern was formed on the surface of the superconducting thin film by wet etching; an etched hole diameter was 100 μm; and an etched hole depth was 1000 nm.

Compared with the laser etching in Example 1, the wet etching was more complex, and had a much lower etching rate. In addition, the wet etching was not suitable for the continuous processing of the 2G-HTS tape with a length of several hundreds of meters. Regarding the 2G-HTS tape fabricated in Comparative Example 3, the length can only reach 20 cm; the critical current degradation at 77 K in self-field was 40%; the irreversible compressive strain measured by a U-Spring technology at a liquid nitrogen temperature or below was not less than 0.8%; and the standard deviation of the critical current retention rate under the 0.8% compressive strain was 2.9%.

Regarding the 2G-HTS tapes prepared by the methods of Examples 1-3, a critical current degradation at 77 K in self-field were all less than 5%, the irreversible compressive strains measured by a U-Spring technology at a liquid nitrogen temperature and below were not less than 0.8%, and the standard deviations of the critical current retention rate under the 0.8% compression strain were less than 5%, the in-batch stability was significantly improved.

In conclusion, this application can solve the problem of poor stability of 2G-HTS tapes under the irreversible compressive strain.

Described above are merely preferred embodiments of the disclosure, which are not intended to limit the disclosure. It should be understood that replacements and modifications made by those skilled in the art without departing from the spirit and scope of the disclosure shall fall within the scope of the disclosure defined by the appended claims.

What is claimed is:

1. A method for fabricating a second generation high-temperature superconductor (2G-HTS) tape, comprising:
   (S1) depositing a first superconducting film on a surface of a ductile metal substrate, wherein the ductile metal substrate is provided with a buffer layer;
   (S2) forming a micro-holes array pattern on a surface of the first superconducting film by etching using a reel-to-reel dynamic femtosecond infrared laser etching system, wherein the micro-holes array pattern covers the first superconducting film;
   (S3) depositing a second superconducting film on the surface of the first superconducting film, wherein a thickness of the second superconducting film is larger than that of the first superconducting film; and
   (S4) depositing a silver protective layer and a copper stabilization layer on a surface of the second superconducting film to fabricate the 2G-HTS tape.

2. The method of claim 1, wherein in step (S1), a structure of the buffer layer is selected from the group consisting of ceric dioxide ($CeO_2$)/yttria-stabilized zirconia (YSZ)/yttrium(III) oxide ($Y_2O_3$), magnesium oxide (MgO), lanthanum manganate ($LaMnO_3$)/MgO/$Y_2O_3$/Al—O and $CeO_2$/MgO/$Y_2O_3$/Al—O.

3. The method of claim 1, wherein in step (S1), the ductile metal substrate is made of a nickel-based high-temperature alloy; and a length of the ductile metal substrate is 50-1500 m.

4. The method of claim 1, wherein in step (S1), the first superconducting film is a rare-earth barium copper oxide (REBCO) layer deposited in situ; and a thickness of the first superconducting film is 100-1000 nm.

5. The method of claim 1, wherein in step (S2), a wavelength of a femtosecond infrared laser of the reel-to-reel dynamic femtosecond infrared laser etching system is 1030 nm.

6. The method of claim 1, wherein in step (S2), an etched hole density of the micro-holes array pattern is 25-1000/$mm^2$; an etched hole diameter is less than 50 μm; and an etched hole depth is not greater than a thickness of the first superconducting film.

7. The method of claim 1, wherein in step (S3), the second superconducting film is a rare-earth barium copper oxide (REBCO) layer deposited in situ; and the thickness of the second superconducting film is 500-5000 nm.

8. A 2G-HTS tape fabricated by the method of claim 1, wherein a critical current degradation of the 2G-HTS tape at 77 K in self-field is less than 5%; an irreversible compressive strain of the 2G-HTS tape measured at a liquid nitrogen temperature or below by a U-Spring technology is not less than 0.8%; and a standard deviation of a critical current retention rate of the 2G-HTS tape under a 0.8% compressive strain is equal to or less than 5%.

* * * * *